(12) United States Patent
Khlat

(10) Patent No.: US 9,698,839 B2
(45) Date of Patent: Jul. 4, 2017

(54) TUNABLE NOTCH FILTER

(71) Applicant: RF Micro Devices, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/006,540

(22) Filed: Jan. 26, 2016

(65) Prior Publication Data

US 2016/0352368 A1 Dec. 1, 2016

Related U.S. Application Data

(60) Provisional application No. 62/168,301, filed on May 29, 2015.

(51) Int. Cl.
| | |
|---|---|
| *H04B 1/10* | (2006.01) |
| *H03H 9/54* | (2006.01) |
| *H03H 9/64* | (2006.01) |
| *H03H 9/02* | (2006.01) |

(52) U.S. Cl.
CPC ............ *H04B 1/1027* (2013.01); *H03H 9/54* (2013.01); *H03H 9/542* (2013.01); *H03H 9/547* (2013.01); *H03H 9/6409* (2013.01); H03H 2009/02165 (2013.01); H03H 2210/012 (2013.01); H03H 2210/025 (2013.01); H04B 2001/1063 (2013.01)

(58) Field of Classification Search
CPC .................................................... H04B 1/1027
USPC ............................................................ 455/296
See application file for complete search history.

(56) References Cited

U.S. PATENT DOCUMENTS

| | | | |
|---|---|---|---|
| 9,065,504 B2 * | 6/2015 | Kwon ................... | H04B 1/0475 |
| 2010/0291946 A1 * | 11/2010 | Yamakawa .......... | H03H 7/0153 |
| | | | 455/454 |
| 2011/0103439 A1 * | 5/2011 | McKay ................. | H04L 5/1423 |
| | | | 375/220 |

* cited by examiner

*Primary Examiner* — Sanh Phu
(74) *Attorney, Agent, or Firm* — Withrow & Terranova, P.L.L.C.

(57) ABSTRACT

Circuitry includes an input node, an output node, acoustic filtering circuitry, an inductive element, and a capacitor. The acoustic filtering circuitry includes an acoustic filtering input node and an acoustic filtering output node. The inductive element is coupled in series with the acoustic filtering circuitry between the input node and the output node such that the inductive element is coupled between the input node and the acoustic filtering input node and the acoustic filtering output node is coupled to the output node. The capacitor is coupled in parallel with the acoustic filtering circuitry and the inductive element between the input node and the output node. Providing the inductive element in series with the acoustic filtering circuitry and the capacitor in parallel with the acoustic filtering circuitry and the inductive element provides a highly selective notch filter response between the input node and the output node with high attenuation.

20 Claims, 6 Drawing Sheets

TUNABLE NOTCH FILTER

RELATED APPLICATIONS

This application claims the benefit of U.S. provisional patent application No. 62/168,301, filed May 29, 2015, the disclosure of which is incorporated herein by reference in its entirety.

FIELD OF THE DISCLOSURE

The present disclosure relates to tunable notch filters, and in particular to tunable notch filters for radio frequency (RF) receivers.

BACKGROUND

As wireless communications standards continue to evolve to provide higher data rates, reliability, and network capacity, technologies such as carrier aggregation and multiple-input-multiple-output (MIMO) have become commonplace. Wireless communications devices utilizing carrier aggregation and/or MIMO use multiple antennas to simultaneously transmit and receive signals within different wireless operating bands. These wireless communications devices require specialized filtering circuitry to separate signals within the different wireless operating bands, which generally adds significant complexity and size to radio frequency (RF) front end circuitry within the devices.

FIG. 1 is a schematic representation of conventional RF front end circuitry 10 capable of operating in a carrier aggregation and/or MIMO configuration. The conventional RF front end circuitry 10 includes a primary antenna 12A, a secondary antenna 12B, antenna switching circuitry 14, primary transceiver circuitry 16, and secondary receiver circuitry 18. The primary transceiver circuitry 16 and the secondary receiver circuitry 18 are coupled to the primary antenna 12A and the secondary antenna 12B via the antenna switching circuitry 14. As shown in FIG. 1, the antenna switching circuitry 14 is a dual-pole, dual-throw (DPDT) switch configured to couple the primary transceiver circuitry 16 to one of the primary antenna 12A and the secondary antenna 12B, and couple the secondary receiver circuitry 18 to the antenna 12 not coupled to the primary transceiver circuitry 16. In normal operation, the primary transceiver circuitry 16 is coupled to the primary antenna 12A in order to transmit and receive primary RF transmit signals and primary RF receive signals therefrom, while the secondary receiver circuitry 18 is coupled to the secondary antenna 12B in order to receive secondary RF receive signals. However, the antenna switching circuitry 14 may swap the primary antenna 12A and the secondary antenna 12B when the performance of the secondary antenna 12B is superior to that of the primary antenna 12A. For example, the antenna switching circuitry 14 may swap the primary antenna 12A and the secondary antenna 12B when a voltage standing wave ratio (VSWR) associated with the secondary antenna 12B is smaller than a VSWR associated with the primary antenna 12A.

The secondary receiver circuitry 18 includes filtering circuitry 20, receiver switching circuitry 22, and a number of low-noise amplifiers (LNAs) 24. The filtering circuitry 20 is coupled to the antenna switching circuitry 14, while the receiver switching circuitry 22 is coupled between the filtering circuitry 20 and the LNAs 24. The filtering circuitry 20 is configured to isolate signals within a particular operating band or group of operating bands received from the antenna 12 so that they may be separately processed. The receiver switching circuitry 22 is configured to couple an output of a filter or group of filters in the filtering circuitry 20 to one of the LNAs 24, where the isolated signal is then amplified for further processing (e.g., baseband conversion). Each one of the LNAs 24 may be designed to amplify a particular operating band or group of operating bands efficiently and with low distortion.

The filtering circuitry 20 may include a number of acoustic filters 26, which may be isolated or grouped together with additional acoustic filters to form an RF multiplexer 28. In its simplest form, the filtering circuitry 20 includes an isolated acoustic filter 26 for each operating band supported by the secondary receiver circuitry 20. However, performance improvements and area reductions may be achieved by grouping the acoustic filters 26 into RF multiplexers 28. Generally, the acoustic filters are band-pass filters configured to pass one or more desired operating bands while attenuating all signals outside of the desired operating bands. The acoustic filters 26 must provide high attenuation at all frequencies outside of the desired pass-band to reduce undesirable distortion, while providing low insertion loss within the pass-band. The largest source of undesirable distortion in the conventional RF front end circuitry 10 generally comes from antenna-to-antenna coupling of primary RF transmit signals into the signal path of the secondary receiver circuitry 18. The primary RF transmit signals are high power signals compared to the secondary RF receive signals, and thus can cause many problems such as desensitization of the secondary receiver circuitry 18. Accordingly, the main purpose of each one of the acoustic filters 26 is to attenuate primary RF transmit signals in the secondary receiver signal path while passing the secondary RF receive signals with as little attenuation as possible.

As the number of operating bands supported by modern wireless communications standards continue to increase, the complexity and size of the filtering circuitry 20, the receiver switching circuitry 22, and the LNAs 24 increases in turn. Since the area of RF front end circuitry is a primary concern in portable wireless communications devices, there is a need for RF front end circuitry configured to operate in carrier aggregation and/or MIMO configurations with reduced size and complexity.

SUMMARY

The present disclosure relates to tunable notch filters, and in particular to tunable notch filters for radio frequency (RF) receivers. In one embodiment, circuitry includes an input node, an output node, acoustic filtering circuitry, an inductive element, and a capacitor. The acoustic filtering circuitry includes an acoustic filtering input node and an acoustic filtering output node. The inductive element is coupled in series with the acoustic filtering circuitry between the input node and the output node such that the inductive element is coupled between the input node and the acoustic filtering input node and the acoustic filtering output node is coupled to the output node. The capacitor is coupled in parallel with the acoustic filtering circuitry and the inductive element between the input node and the output node. Providing the inductive element in series with the acoustic filtering circuitry and the capacitor in parallel with the acoustic filtering circuitry and the inductive element provides a highly selective notch filter response between the input node and the output node with high attenuation.

In one embodiment, the capacitor is tunable. Making the capacitor tunable allows the notch filter response between the input node and the output node to be adjusted to attenuate different frequencies.

In one embodiment, the circuitry further includes an additional inductive element coupled in parallel with the acoustic filtering circuitry and the inductive element between the input node and the output node. In one embodiment, the inductive element and the additional inductive element are electromagnetically coupled. Further, the electromagnetic coupling between the inductive element and the additional inductive element may be tunable in order to further adjust the notch filter response between the input node and the output node.

In one embodiment, the circuitry further includes a second additional inductive element coupled between the acoustic filtering output node and the output node. The circuitry may also include a third inductive element coupled in series with the first additional inductive element between the input node and the output node such that the third additional inductive element is coupled between the first additional inductive element and the output node. In one embodiment, the second additional inductive element is electromagnetically coupled with the third additional inductive element. Further, the electromagnetic coupling between the second additional inductive element and the third additional inductive element may be tunable in order to further adjust the notch filter response between the input node and the output node.

In one embodiment, the circuitry further includes an additional capacitor coupled between the acoustic filtering output node and the connection between the first additional inductive element and the third additional inductive element. The additional capacitor may be tunable in some embodiments in order to further adjust the notch filter response between the input node and the output node.

In one embodiment, the circuitry further includes additional acoustic filtering circuitry coupled in parallel with the acoustic filtering circuitry between the acoustic filtering input node and the acoustic filtering output node. Acoustic filtering switching circuitry may be configured to couple one of the acoustic filtering circuitry and the additional acoustic filtering circuitry in series with the inductive element while isolating the other. Providing the additional acoustic filtering circuitry may allow the notch filter response between the input node and the output node to be adjusted over a wider bandwidth.

In one embodiment, the acoustic filtering circuitry is an acoustic resonator, such as a bulk acoustic wave (BAW) resonator and a surface acoustic wave (SAW) resonator.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
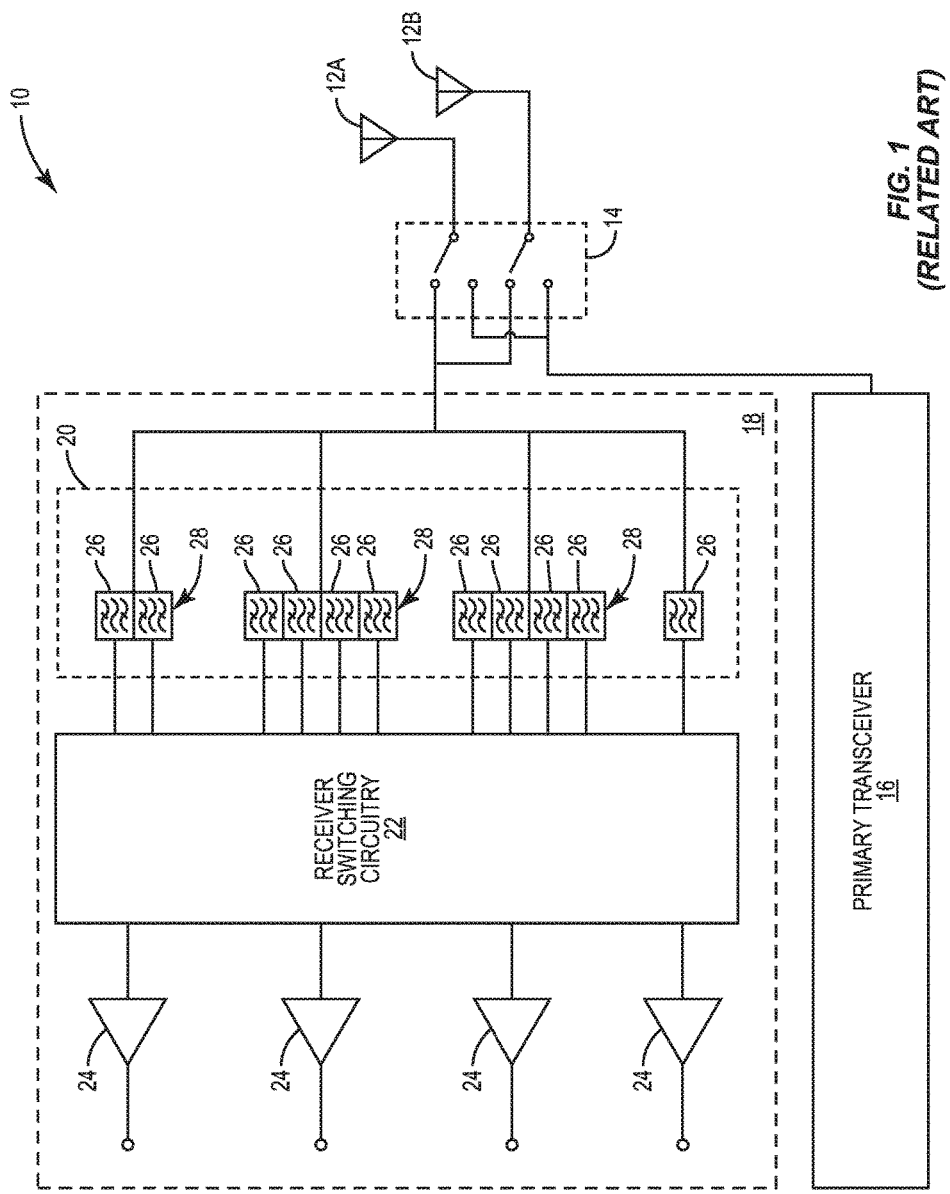
FIG. 1 is a schematic representation of conventional radio frequency (RF) front end circuitry.
Figure 2:
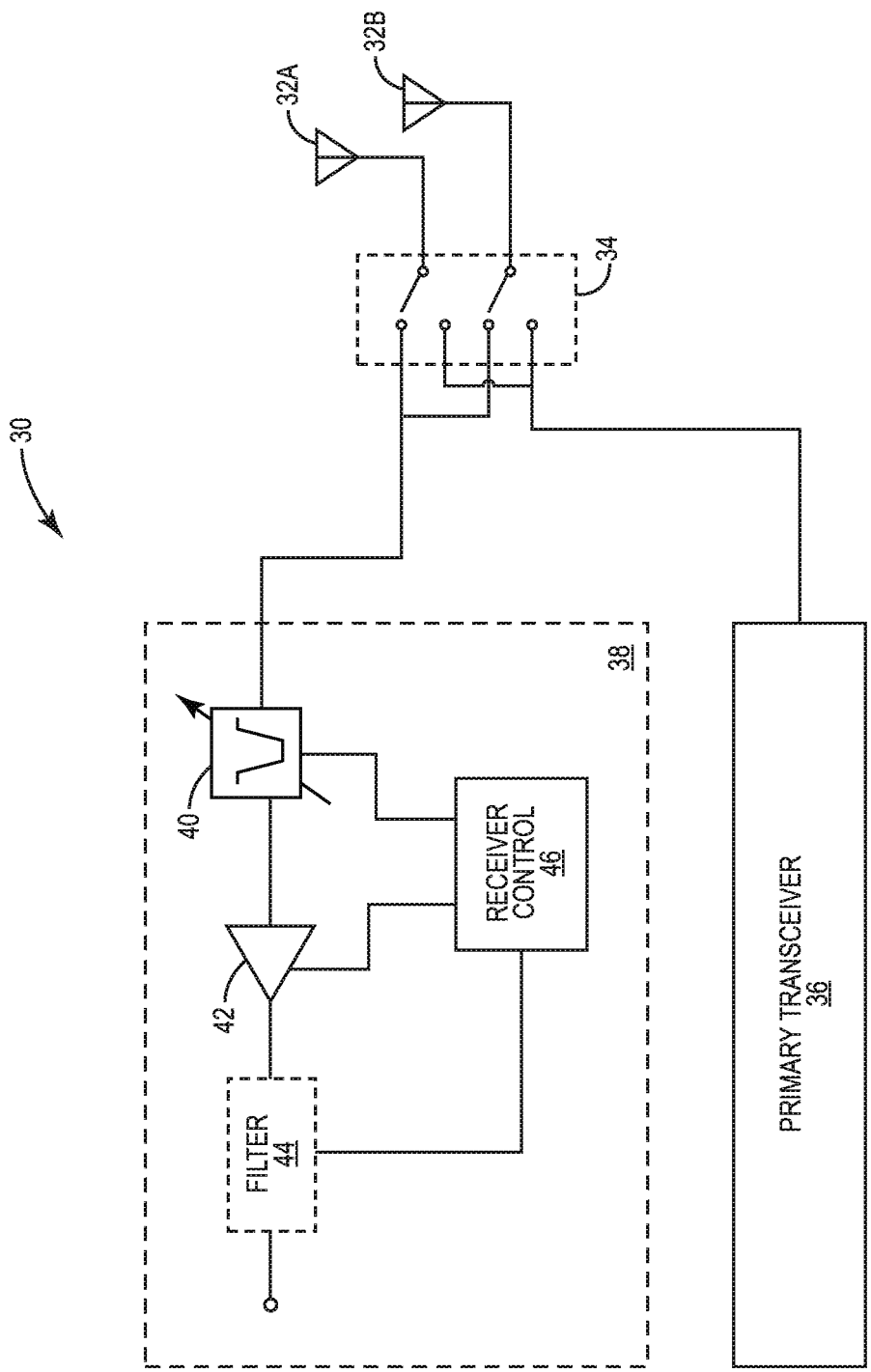
FIG. 2 is a schematic representation of RF front end circuitry according to one embodiment of the present disclosure.

FIG. 2 shows radio frequency (RF) front end circuitry 30 according to one embodiment of the present disclosure. The RF front end circuitry 30 includes a primary antenna 32A, a secondary antenna 32B, antenna switching circuitry 34, primary transceiver circuitry 36, and secondary receiver circuitry 38. The primary transceiver circuitry 36 and the secondary receiver circuitry 38 are coupled to the primary antenna 32A and the secondary antenna 32B via the antenna switching circuitry 34. The antenna switching circuitry 34 is configured to couple the primary transceiver circuitry 36 to one of the primary antenna 32A and the secondary antenna 32B, and couple the secondary receiver circuitry 38 to the antenna 32 not coupled to the primary transceiver circuitry 36. While only two antennas are shown, the principles of the present disclosure apply equally to RF front ends including additional antennas. In normal operation, the primary transceiver circuitry 36 is coupled to the primary antenna 32A in order to transmit and receive primary RF transmit signals and primary RF receive signals therefrom, while the secondary receiver circuitry 38 is coupled to the secondary antenna 32B in order to receive secondary RF receive signals. However, the antenna switching circuitry 34 may swap the primary antenna 32A and the secondary antenna 32B when the performance of the secondary antenna 32B is superior to that of the primary antenna 32A. For example, the antenna switching circuitry 34 may swap the primary antenna 32A and the secondary antenna 32B when a voltage standing wave ratio (VSWR) associated with the secondary antenna 32B is smaller than a VSWR associated with the primary antenna 32A.

The secondary receiver circuitry 38 includes a tunable notch filter 40, a low-noise amplifier (LNA) 42, optional additional filtering circuitry 44, and receiver control circuitry 46. The tunable notch filter 40 is coupled to the antenna switching circuitry 34, and the LNA 42 is coupled between the tunable notch filter 40 and the additional filtering circuitry 44. The receiver control circuitry 46 is coupled to each one of the tunable notch filter 40, the LNA 42, and the additional filtering circuitry 44. While the receiver control circuitry 46 is shown in the secondary receiver circuitry 38, the tunable notch filter 40, the LNA 42, and the additional filtering circuitry 44 may also be adjusted by external control signals received at the secondary receiver circuitry 38 in some embodiments. The tunable notch filter 40 is configured to attenuate signals within an RF blocker frequency band, while passing signals outside of the RF blocker frequency band. In general, the RF blocker frequency band corresponds to the operating band of one or more primary RF transmit signals provided from the primary transceiver circuitry 36. This is due to the fact that primary RF transmit signals are the largest source of distortion in the secondary receiver signal path as discussed above. The LNA 42 amplifies the filtered receive signal, and provides the filtered and amplified receive signal to the additional filtering circuitry 44. The additional filtering circuitry 44 may further filter the receive signal such that the signal is suitable for additional processing (e.g., baseband conversion).

The receiver control circuitry 46 may adjust the tunable notch filter 40 such that the RF blocker frequency band corresponds to the operating band of one or more primary RF transmit signals provided from the primary transceiver circuitry 36. Further, the receiver control circuitry 46 may adjust one or more aspects of the operation of the LNA 42 in order to optimize the performance of the LNA 42 for the operating band or operating bands of the secondary RF receive signals. For example, the receiver control circuitry 46 may adjust a bias associated with the LNA based on the operating band or operating bands of the secondary RF receive signals. Finally, the receiver control circuitry 46 may adjust a filter response of the additional filtering circuitry 44.

Using the RF front end circuitry 30 described above allows the RF front end circuitry 30 to support the reception of a large number of operating bands with a single tunable notch filter and without the need for complex receiver switching circuitry. This significantly reduces the area and complexity of the secondary receiver circuitry 38. However, designing tunable notch filters with the necessary isolation, insertion loss, and selectivity to maintain the performance of the RF front end circuitry 30 is a difficult task. Acoustic filtering circuitry, while providing good isolation and selectively, may provide significant insertion loss in frequency bands adjacent to a notch in the filter response thereof, and further is not tunable over any significant bandwidth. Lumped LC filters are highly tunable, but provide relatively poor selectivity and insertion loss in adjacent bands to a notch in the filter response thereof.

Figure 3:
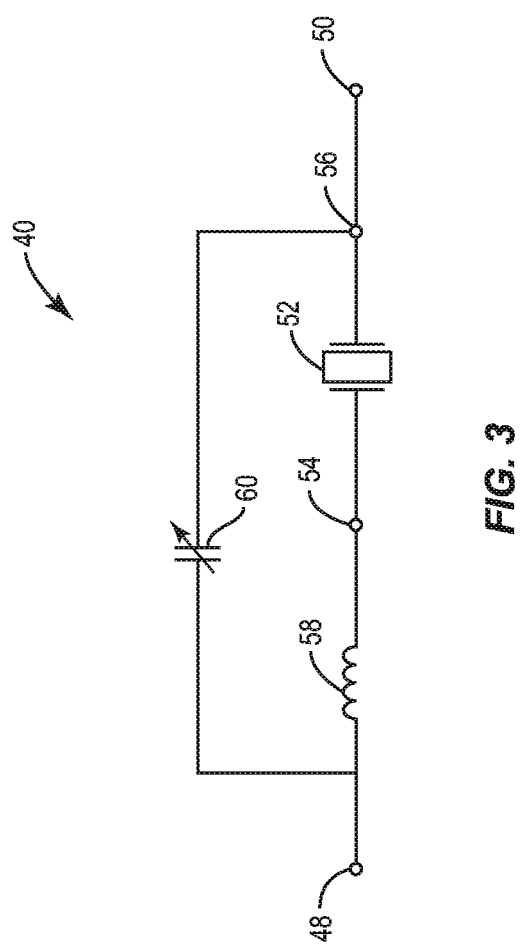
FIG. 3 is a schematic representation of a tunable notch filter according to one embodiment of the present disclosure.

FIG. 3 shows the tunable notch filter 40 according to one embodiment of the present disclosure. The tunable notch filter 40 includes an input node 48, an output node 50, acoustic filtering circuitry 52 including an acoustic filtering input node 54 and an acoustic filtering output node 56, an inductive element 58 coupled in series with the acoustic filtering circuitry 52 such that the inductive element 58 is coupled between the input node 48 and the acoustic filtering input node 54, and a capacitor 60 coupled in parallel with the acoustic filtering circuitry 52 and the inductive element 58 between the input node 48 and the output node 50. The acoustic filtering circuitry 52 may be a surface acoustic wave (SAW) filter or a bulk acoustic wave filter (BAW) configured to attenuate signals within an RF blocker frequency band while passing signals outside of the RF blocker frequency band. In other words, the acoustic filtering circuitry 52 may be a notch filter. As discussed above, acoustic filtering circuitry provides good isolation and selectively, but may have relatively high insertion loss adjacent to a notch in the filter response thereof. Providing the inductive element 58 in series with the acoustic filtering circuitry 52 effectively reduces the series resonance of the acoustic filtering circuitry 52 and reduces the insertion loss at frequencies below the notch in the filter response thereof. Providing the capacitor 60 in parallel with the acoustic filtering circuitry 52 and the inductive element 58 passes high frequency signals, which decreases insertion loss at frequencies above the notch in the filter response, although it may also reduce the depth of the notch and thus the attenuation in the RF blocker frequency band. Making the capacitor 60 tunable allows the position of the notch (and thus the RF blocker frequency band) to be adjusted in order to block primary RF transmit signals in a number of different operating bands. In one embodiment, designing the tunable notch filter 40 as discussed above allows the RF blocker frequency band to be adjusted over a frequency range of about 40 MHz.

Figure 4A:
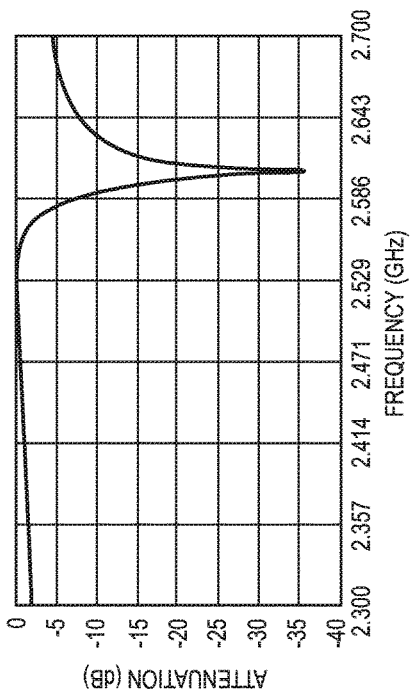
FIGS. 4A through 4C are graphs illustrating a filter response of a tunable notch filter according to various embodiments of the present disclosure.
Figure 4C:
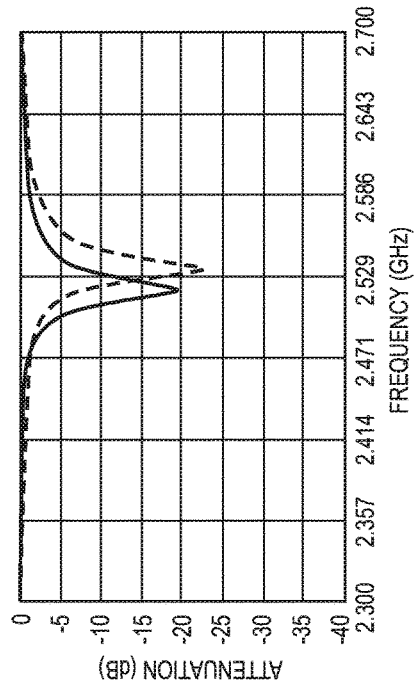
Figure 4B:
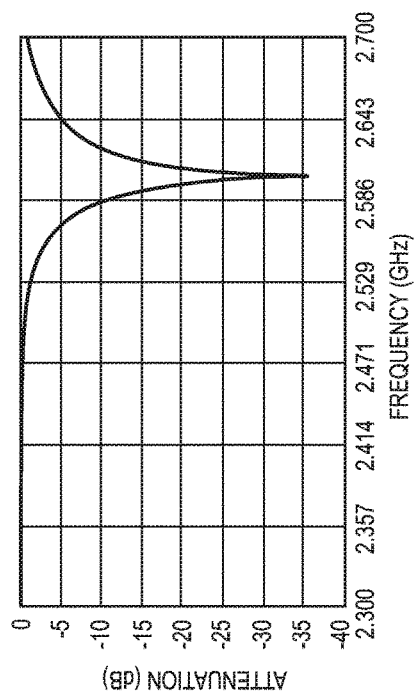

FIG. 4A illustrates the filter response of the acoustic filtering circuitry 52 by itself. As shown in FIG. 4A, the notch response of the acoustic filtering circuitry 52 has sharp roll-off, but relatively high insertion loss both above and below the notch. FIG. 4B illustrates the filter response of the acoustic filtering circuitry 52 in series with the inductive element 58. As shown in FIG. 4B, the insertion loss below the notch is greatly improved when using the inductive element 58. FIG. 4C illustrates the filter response of the tunable notch filter 40 including the acoustic filtering circuitry 52, the inductive element 58, and the capacitor 60. As shown in FIG. 4C, the insertion loss above the notch is greatly improved, the depth of the notch is reduced, and the notch is tunable over a relatively wide frequency range.

In one embodiment, the acoustic filtering circuitry 52 may have a resonant frequency (and thus a filter notch) between 2.5 GHz and 2.7 GHz. The bandwidth of the acoustic filtering circuitry 52 may be limited to about 40 MHz. The inductive element 58 may comprise a number of inductors. For example, the inductive element 58 may comprise two inductors coupled in series, each with a value between about 1 nH and 4 nH and a quality factor between 30 and 70. The capacitive element may be adjustable from about 0.75 pF to about 2 pF, and may have a quality factor between about 150 and 250. Those skilled in the art will appreciate that the above values for the various components in the tunable notch filter 40 are merely illustrative, and that the principles of the present disclosure apply equally to components of any value.

Figure 5:
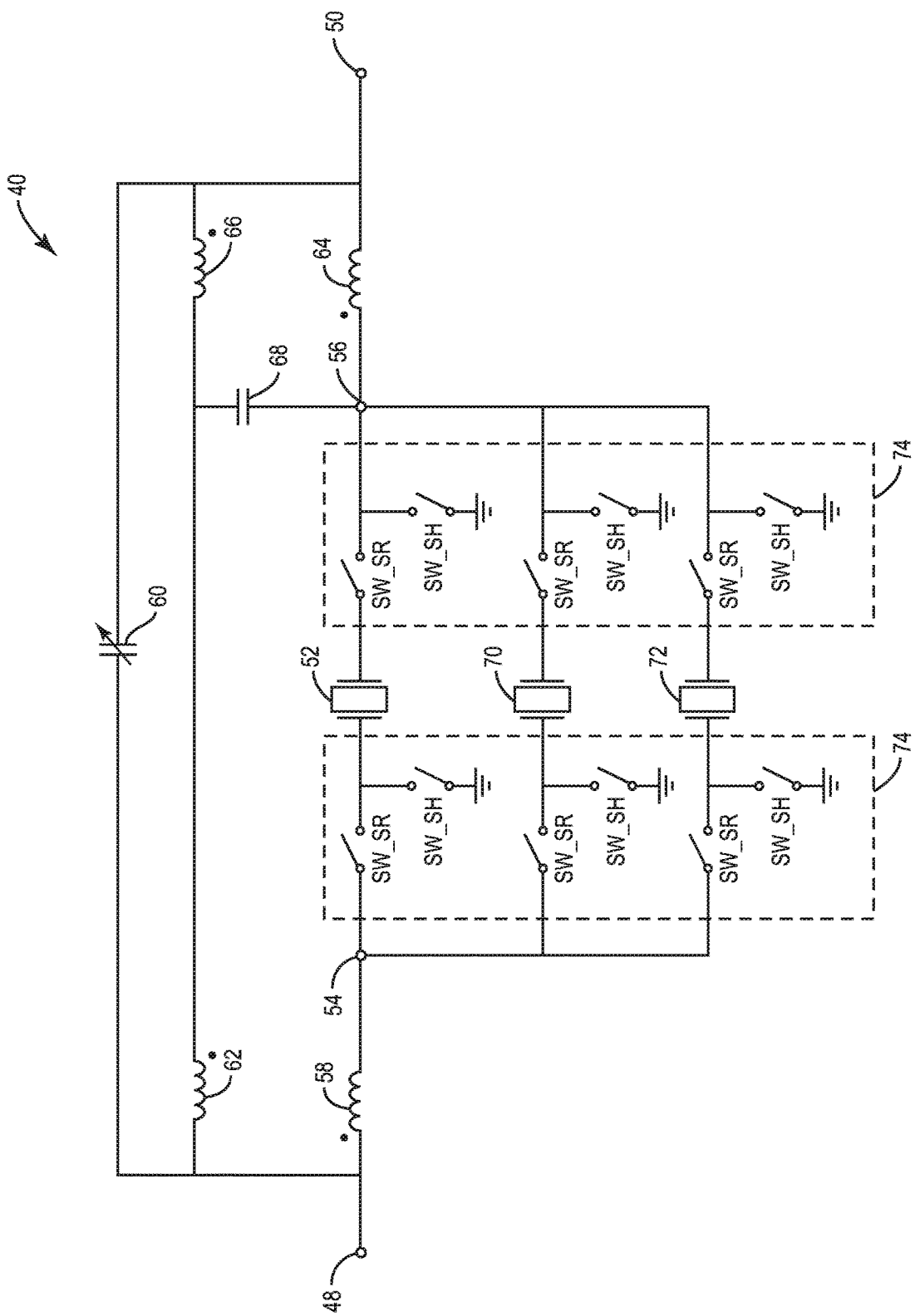
FIG. 5 is a schematic representation of a notch filter according to one embodiment of the present disclosure.

FIG. 5 shows the tunable notch filter 40 according to an additional embodiment of the present disclosure. The tunable notch filter 40 shown in FIG. 5 is substantially similar to that shown above in FIG. 3, including the acoustic filtering circuitry 52, the inductive element 58, and the capacitor 60, but further includes a first additional inductive element 62, a second additional inductive element 64, a third additional inductive element 66, an additional capacitor 68, first additional acoustic filtering circuitry 70, second additional acoustic filtering circuitry 72, and acoustic filtering switching circuitry 74. The first additional inductive element 62 is coupled in parallel with the acoustic filtering circuitry 52 and the inductive element 58 between the input node 48 and the output node 50. In some embodiments, the inductive element 58 and the first additional inductive element 62 are electromagnetically coupled. Further, the electromagnetic coupling between the inductive element 58 and the first additional inductive element 62 may be adjustable. The second additional inductive element 64 is coupled in series with the acoustic filtering circuitry 52 and the inductive element 58, such that the second additional inductive element 64 is coupled between the acoustic filtering output node 56 and the output node 50. The third additional inductive element 66 is coupled in series with the first additional inductive element 62 such that the third additional inductive element 66 is coupled between the first additional inductive element 62 and the output node 50. The second additional inductive element 64 and the third additional inductive element 66 may be electromagnetically coupled. Further, the electromagnetic coupling between the second additional inductive element 64 and the third additional inductive element 66 may be adjustable.

The additional capacitor 68 is coupled between the acoustic filtering output node 56 and the connection between the first additional inductive element 62 and the third additional inductive element 66. In one embodiment, the additional capacitor 68 is tunable. The first additional acoustic filtering circuitry 70 and the second additional acoustic filtering circuitry 72 are coupled in parallel with the acoustic filtering circuitry 52 and separated from one another by the acoustic filtering switching circuitry 74. The acoustic filtering switching circuitry 74 includes a number of series switches SW_SR configured to couple one of the acoustic filtering circuitry 52, the first additional acoustic filtering circuitry 70, and the second additional acoustic filtering circuitry 72 in the signal path of the tunable notch filter 40 while isolating the ones of the acoustic filtering circuitry 52, the first additional acoustic filtering circuitry 70, and the second additional acoustic filtering circuitry 72. Further, the acoustic filtering switching circuitry 74 includes a number of shunt switches SW_SH configured to ground the input and output of the ones of the acoustic filtering circuitry 52, the first additional acoustic filtering circuitry 70, and the second additional acoustic filtering circuitry 72 not coupled in the signal path of the tunable notch filter 40 in order to avoid undesirable distortion in the output of the tunable notch filter.

Each one of the acoustic filtering circuitry 52, the first additional acoustic filtering circuitry 70, and the second additional acoustic filtering circuitry 72 may provide a notch filter response at a particular notch center frequency. The notch center frequency of each one of the acoustic filtering circuitry 52, the first additional acoustic filtering circuitry 70, and the second additional acoustic filtering circuitry 72 are different. Accordingly, switching between the acoustic filtering circuitry 52, the first additional acoustic filtering circuitry 70, and the second additional acoustic filtering circuitry 72 changes the location of the notch in the tunable notch filter 40, which allows the tunable notch filter 40 to be used to filter RF blocker signals in a number of different operating bands. In general, the acoustic filtering circuitry in the signal path of the tunable notch filter 40 provides a base filter response. To improve and adjust the filter response provided by the acoustic filtering circuitry, the surrounding components are provided and adjusted as described below.

The receiver control circuitry 46 may be configured to tune the capacitor 60, the additional capacitor 68, the electromagnetic coupling between the inductive element 58 and the first additional inductive element 62, and the electromagnetic coupling between the second additional inductive element 64 and the third additional inductive element 66. Tuning the capacitor 60 and the additional capacitor 68 may change the position of the notch filter response of the tunable notch filter 40, thereby allowing the filter to be used for a variety of operating bands. Adjusting the electromagnetic coupling between the inductive element 58 and the first additional inductive element 62 and the second additional inductive element 64 and the third additional inductive element 66, respectively, may change the width of the notch filter response of the tunable notch filter 40, which may increase the flexibility of the filter and therefore allow it to be used for a variety of operating bands.

In one embodiment, the capacitor 60, the additional capacitor 68, and the acoustic filtering switching circuitry 74 are integrated onto the same semiconductor die as the LNA 42 shown above in FIG. 2. The inductive element 58, the first additional inductive element 62, the second additional inductive element 64, and the third additional inductive element 66 may each be provided on a laminate on which the semiconductor die including the capacitor 60, the additional capacitor 68, the acoustic filtering switching circuitry 74, and the LNA 42 is provided. The acoustic filtering circuitry 52, the first additional acoustic filtering circuitry 70, and the second additional acoustic filtering circuitry 72 may be provided on the same or different acoustic substrates (depending on the bandwidth requirements of the tunable notch filter 40) and coupled to the laminate described above. In one embodiment, the acoustic filtering circuitry 52, the first additional acoustic filtering circuitry 70, and the second additional acoustic filtering circuitry 72 are surface acoustic wave (SAW) resonators or bulk acoustic wave (BAW) resonators. However, the principles of the present disclosure may be applied to acoustic filtering circuitry of any kind.

Figure 6A:
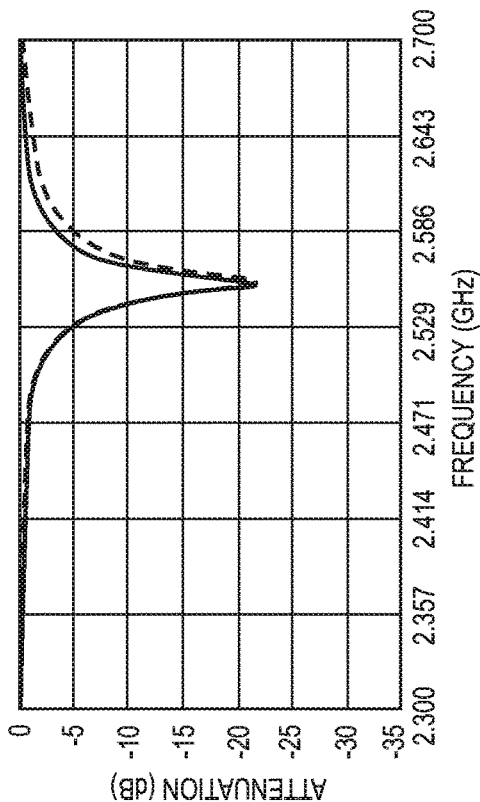
FIGS. 6A and 6B are graphs illustrating a filter response of a tunable notch filter according to various embodiments of the present disclosure.
Figure 6B:
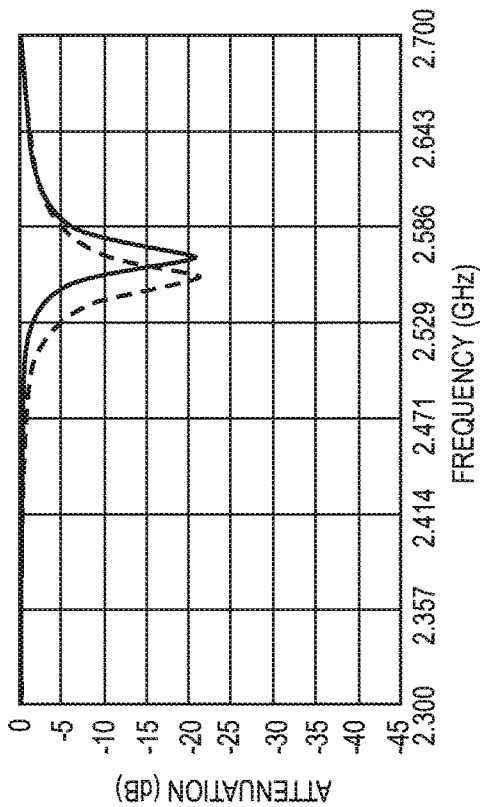

FIG. 6A illustrates a filter response of the tunable notch filter 40 including the acoustic filtering circuitry 52, the inductive element 58, the capacitor 60, and the first additional inductive element 62. As shown in FIG. 6A, providing the first additional inductive element 62 allows the width of the notch response to be adjusted by adjusting the amount of electromagnetic coupling between the inductive element 58 and the first additional inductive element 62. FIG. 6B illustrates a filter response of the tunable notch filter 40 further including the second additional inductive element 64, the third additional inductive element 66, and the additional capacitor 68. As shown in FIG. 6B, the insertion loss at frequencies above the notch is improved in this configuration. Additionally, the position and width of the notch may be further adjustable by adjusting the capacitance of the additional capacitor 68 and the amount of electromagnetic coupling between the second additional inductive element 64 and the third additional inductive element 66, respectively.

Providing the tunable notch filter 40 as discussed above results in a filter with high isolation (e.g., greater than 10 dB within the RF blocker frequency band), low insertion loss at frequencies near the RF blocker frequency band (e.g., less than 1 dB within 20 MHz of the RF blocker frequency band), and high selectivity. Accordingly, the tunable notch filter 40 may replace conventional filtering circuitry that uses a large number of individual or grouped filters, which saves significant space in a wireless communications device.

Those skilled in the art will recognize improvements and modifications to the embodiments of the present disclosure. All such improvements and modifications are considered within the scope of the concepts disclosed herein and the claims that follow.

What is claimed is:
1. A tunable notch filter comprising:
   a filter input node;
   a filter output node;
   an acoustic resonator comprising a resonator input node and a resonator output node;
   an inductive element coupled in series with the acoustic resonator between the filter input node and the filter output node such that the inductive element is coupled between the filter input node and the resonator input node and the resonator output node is coupled to the filter output node; and
   a capacitor coupled in parallel with the acoustic resonator and the inductive element between the filter input node and the filter output node.

2. The tunable notch filter of claim 1 wherein the capacitor is tunable.

3. The tunable notch filter of claim 2 further comprising a first additional inductive element coupled in parallel with the acoustic resonator and the inductive element between the filter input node and the filter output node.

4. The tunable notch filter of claim 3 wherein the first additional inductive element is electromagnetically coupled with the inductive element.

5. The tunable notch filter of claim 4 wherein the electromagnetic coupling between the inductive element and the first additional inductive element is tunable.

6. The tunable notch filter of claim 5 further comprising:
a second additional inductive element coupled between the acoustic resonator output node and the filter output node; and
a third additional inductive element coupled in series with the first additional inductive element between the filter input node and the filter output node such that the third additional inductive element is coupled between the first additional inductive element and the filter output node.

7. The tunable notch filter of claim 6 wherein the second additional inductive element is electromagnetically coupled to the third additional inductive element.

8. The tunable notch filter of claim 7 wherein the electromagnetic coupling between the second additional inductive element and the third additional inductive element is tunable.

9. The tunable notch filter of claim 8 further comprising an additional capacitor coupled between the resonator output node and a connection between the first additional inductive element and the third additional inductive element.

10. The tunable notch filter of claim 9 wherein the additional capacitor is tunable.

11. The tunable notch filter of claim 10 further comprising an additional acoustic resonator coupled in parallel with the acoustic resonator between the resonator input node and the resonator output node.

12. The tunable notch filter of claim 11 further comprising acoustic filtering switching circuitry configured to couple one of the acoustic resonator and the additional acoustic resonator in series with the inductive element while isolating the other of either the acoustic resonator or the additional acoustic resonator.

13. The tunable notch filter of claim 10 wherein the acoustic resonator is one of a bulk acoustic wave (BAW) resonator and a surface acoustic wave (SAW) resonator.

14. Radio frequency (RF) front end circuitry comprising:
a plurality of antenna nodes;
primary transceiver circuitry;
secondary receiver circuitry comprising:
  low-noise amplifier circuitry; and
  filtering circuitry comprising:
    a filter input node;
    a filter output node coupled to the low-noise amplifier circuitry;
    an acoustic resonator comprising a resonator input node and a resonator output node;
    an inductive element coupled in series with the acoustic resonator between the filter input node and the filter output node such that the inductive element is coupled between the filter input node and the resonator input node and the resonator output node is coupled to the filter output node; and
    a capacitor in parallel with the acoustic resonator and the inductive element between the filter input node and the filter output node; and
antenna switching circuitry coupled between the primary transceiver circuitry, the secondary receiver circuitry, and the plurality of antenna nodes.

15. The RF front end circuitry of claim 14 wherein the capacitor is tunable.

16. The RF front end circuitry of claim 15 further comprising control circuitry configured to tune the capacitor such that the filtering circuitry provides a notch filter response corresponding to a frequency of a primary transmit signal provided by the primary transceiver circuitry.

17. The RF front end circuitry of claim 16 wherein:
the primary transceiver circuitry is configured to provide primary transmit signals to one or more of the plurality of antenna nodes and receive primary receive signals from the one or more of the plurality of antenna nodes via the antenna switching circuitry; and
the secondary receiver circuitry is configured to receive secondary receive signals from a different one of the plurality of antenna nodes via the antenna switching circuitry.

18. The RF front end circuitry of claim 17 wherein the filtering circuitry is configured to filter the secondary receive signals.

19. The RF front end circuitry of claim 18 wherein the antenna switching circuitry is configured to couple the primary transceiver circuitry to a first set of the plurality of antenna nodes and couple the secondary receiver circuitry to a second set of the plurality of antenna nodes, wherein the first set and the second set are mutually exclusive.

20. The RF front end circuitry of claim 19 wherein the acoustic resonator is one of a bulk acoustic wave (BAW) resonator and a surface acoustic wave (SAW) resonator.

* * * * *